United States Patent [19]

Bergeron et al.

[11] 4,395,812
[45] Aug. 2, 1983

[54] FORMING AN INTEGRATED CIRCUIT

[75] Inventors: David L. Bergeron, Winooski, Vt.; Geoffrey B. Stephens, Cary, N.C.

[73] Assignee: IBM Corporation, Armonk, N.Y.

[21] Appl. No.: 270,778

[22] Filed: Jun. 5, 1981

Related U.S. Application Data

[60] Division of Ser. No. 118,248, Feb. 4, 1980, Pat. No. 4,314,267, which is a continuation of Ser. No. 915,337, Jun. 13, 1978, abandoned.

[51] Int. Cl.³ ......................................... H01L 21/265
[52] U.S. Cl. ...................................... 29/571; 29/576 B; 29/577 C; 148/175; 148/187
[58] Field of Search .................. 148/175, 187; 29/571, 29/576 B, 577 C; 357/43

[56] References Cited

U.S. PATENT DOCUMENTS

| | | | |
|---|---|---|---|
| 4,049,476 | 9/1977 | Horie | 29/571 X |
| 4,066,917 | 1/1978 | Compton et al. | 357/43 X |
| 4,110,126 | 8/1978 | Bergeron et al. | 148/1.5 |
| 4,143,392 | 3/1979 | Mylroie | 357/43 |
| 4,233,615 | 11/1980 | Takemoto et al. | 357/43 X |
| 4,314,267 | 2/1982 | Bergeron et al. | 357/43 |

Primary Examiner—G. Ozaki
Attorney, Agent, or Firm—John E. Hoel

[57] ABSTRACT

A high performance JFET structure and process are disclosed which are compatible with high performance NPN transistors. The high performance JFET is merged in a bipolar/FET device which forms a dense, two level logic function. The JFET can be employed as a switched device or as an active load in a bipolar logic circuit and is formed in the P-type base diffusion of what would otherwise have been an NPN transistor. In the BIFET merged device, the JFET and bipolar transistor share a common base and drain and a common collector and gate in the P-type base region of what would otherwise have been an NPN transistor. Both an NPN type BIFET and an PNP type BIFET are disclosed. The merged JFET and bipolar transistor provide better than a 30% area reduction when compared to their non-merged precursors.

5 Claims, 16 Drawing Figures

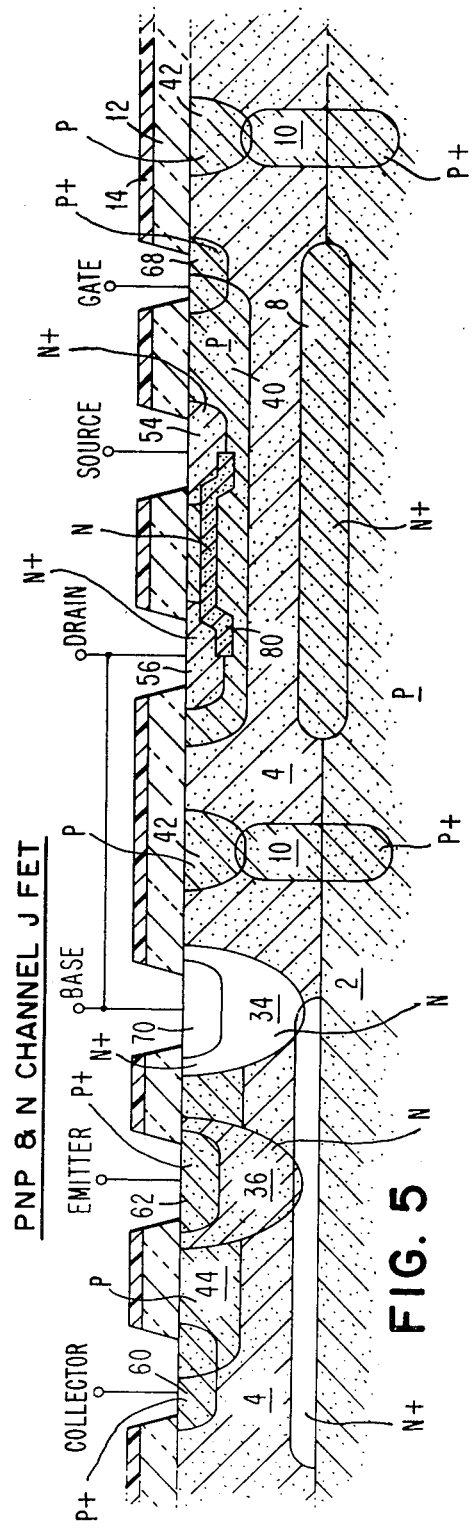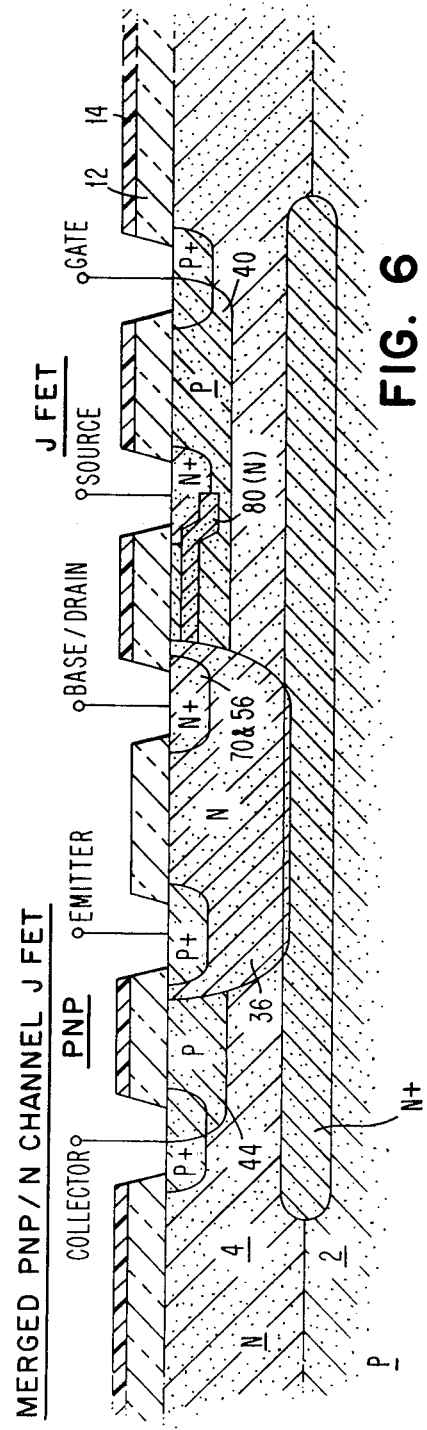

FORMING AN INTEGRATED CIRCUIT

This is a division of application Ser. No. 118,248, filed Feb. 4, 1980, now U.S. Pat. No. 4,314,267, which is a continuation of application Ser. No. 915,337, filed June 13, 1978, now abandoned.

FIELD OF THE INVENTION

The invention broadly relates to semiconductor structures and more particularly relates to junction field effect transistors.

BACKGROUND OF THE INVENTION

Previous methods for fabricating JFET's in the same silicon integrated circuit process with NPN transistors have used an N-type epitaxial layer as the N channel region where P+ base regions acted as the gate and N+ contacts as the source and drain regions.

This approach pays a penalty in device size and performance as the N-type epitaxial layer with its large tolerance in thickness and resistivity, dominated the JFET characteristics.

M. N. Phan, et al, "A Fast 1024-Bit Bipolar RAM Using JFET Load Devices", 1977 *IEEE International Solid State Circuit Conference, Digest of Technical Papers*, pp. 70–71 and 238 discloses the formation of an N-epitaxial layer on top of a P-type substrate, through which a recessed oxidation isolation is formed which goes through the epitaxial layer and into the substrate. The process of oxidation at the epitaxial layer/substrate interface depletes the substrate surface of the boron P-type dopant, thereby forming an N-type channel along the bottom of the recessed oxide, which becomes the channel of the JFET. This JFET process, which is compatible with a bipolar process, contributes no control over the transconductance characteristics of the JFET device. Furthermore, the JFET device cannot be used as a switch since the entire epitaxial layer itself is the gate for the device and cannot be switched at a rapid enough rate to enable its use as a practical logical element.

B. Jayant Baliga, et al., "Gambi: Gate Modulated Bipolar Transistor", *Solid State Electronics*, 1975, Vol. 18, pp. 937–941, discloses a merged JFET device and bipolar transistor which merges the collector of the PNP transistor with the gate of the JFET. By reverse biasing the base/collector junction, the base current is pinched off in JFET fashion, using the N-type epitaxial layer as the channel. The JFET device is subject to the variability in the epitaxial layer thickness and doping levels which yields a JFET device having broad tolerances in the transconductance. The device can only be used as a bistable device and never as an active logic switch.

The device makes poor use of silicon area and has a different structure than that disclosed in the subject disclosures.

OBJECTS OF THE INVENTION

It is therefore an object of the invention to provide an improved junction field effect transistor device.

It is another object of the invention to provide a more dense junction field effect transistor device.

It is still another object of the invention to provide a junction field effect transistor device having reduced tolerances in its functional characteristics.

It is yet another object of the invention to provide a junction field effect transistor which can be readily fabricated in existing bipolar processes.

It is an object of the invention to provide an improved active load in a bipolar logic circuit.

It is still another object of the invention to provide a merged junction field effect transistor and a bipolar transistor device which permits the implementation of complex logic functions in a reduced area.

SUMMARY OF THE INVENTION

These and other objects, features and advantages of the invention are accomplished by the dense high performance JFET compatible with NPN and PNP transistor formation and merged drain BIFET, disclosed herein.

A high performance JFET structure and process are disclosed which are compatible with high performance NPN bipolar transistors. The high performance JFET is merged in a bipolar/FET device which forms a dense, two level logic function. The JFET can be employed as a switched device or as an active load in a bipolar logic circuit and is formed in the P-type base diffusion of what would otherwise have been an NPN transistor. In the BIFET merged device, the JFET and bipolar transistor share a common base and drain and a common collector and a gate in the P-type base region of what would otherwise have been an NPN transistor. Both NPN type BIFET and PNP type BIFET are disclosed. The merged JFET and bipolar transistor provide better than a 30% area reduction when compared to their non-merged precursors.

The JFET, as an active load in a bipolar logic circuit, provides a controllable impedance for reduced power dissipation without greatly increasing the complexity of the the bipolar process.

The merged JFET/bipolar device provides a very dense logic function when the JFET is used as a switch, yielding a 30% area reduction for the JFET/PNP and a 34% area reduction for the JFET/NPN, when compared with unmerged layouts. When the JFET is used as an active load device in a bipolar circuit, it provides a substantially reduced power dissipation characteristic over other types of loads. The JFET/bipolar structure is extendable to multiple JFET/PNP devices for the implementation of complex logic functions.

DESCRIPTION OF THE FIGURES

These and other objects, features and advantages of the invention will be more fully appreciated with reference to the accompanying figures.

FIG. 5 is a cross-sectional view of a conventional, double diffused PNP device and the N channel JFET invention, where the PNP device is fabricated in the referenced copending application FIGS. 3A through 3I and the JFET device is as shown in FIG. 2b, herein.

FIG. 6 is a cross-sectional view of the merged PNP and JFET device which has been accomplished by combining the common N-epitaxial regions of the PNP base and JFET drain in FIG. 5, where the drain is now formed by the deep N-type region 36.

DISCUSSION OF A PREFERRED EMBODIMENT

Previous methods for fabricating JFET's in the same silicon integrated circuit process with NPN bipolar transistors have used the N-type epitaxial layer as the N channel region where P+ base regions acted as the gate and N+ contacts the source and drain regions.

This approach pays a penalty in device size and performance as the N-type epitaxial layer with its large tolerance in thickness and resistivity, dominated the JFET characteristics. The process described here takes advantage of the double boron implant, defining the P-type base region proposed in the simplified NPN processes with ion-implanted structures to fabricate with one additional mask and implant step a high performance JFET, with very controllable characteristics. The sequence follows conventional masking and process techniques through epitaxial growth and reoxidation. The base and emitter structure can be fabricated using standard diffusion and masking techniques; however, better control of the JFET is obtained when the emitter-base is implanted as outlined in FIG. 3A through 3I of copending U.S. Pat. No. 4,110,126 and assigned to the instant assignee, and the implanted structure will be discussed here.

Figure 1:
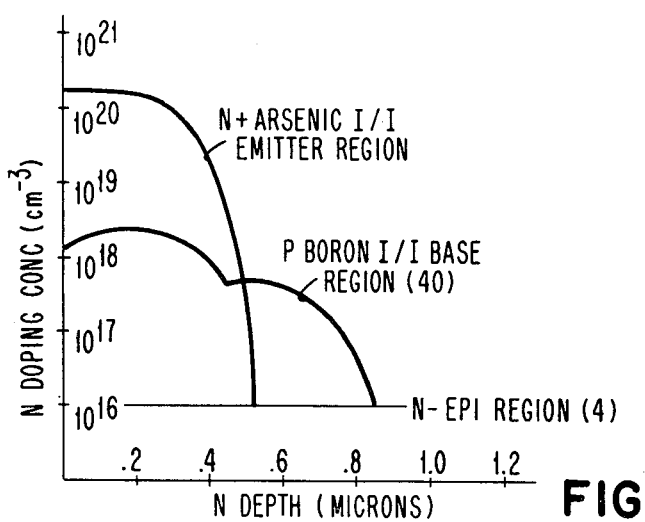
FIG. 1 is a doping profile of an NPN transistor after processing, as described in copending U.S. Ser. No. 829,302, now U.S. Pat. No. 4,110,126 in FIG. 3I.
Figure 2A:
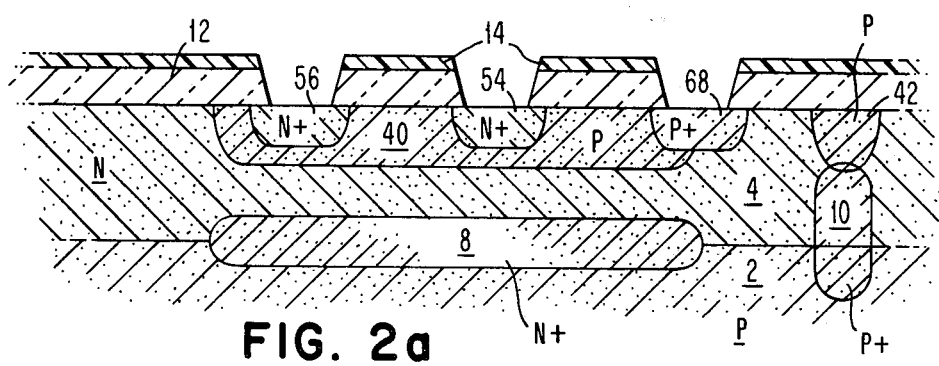
FIG. 2a is a cross-sectional view of the JFET device prior to the implantation of the channel region, this figure corresponding to the NPN transistor structure of FIG. 3I in the referenced copending application, with the omission of the collector diffusion 38 and the extension of the base region 40 to envelop the N+ diffusion 56.
Figure 2B:
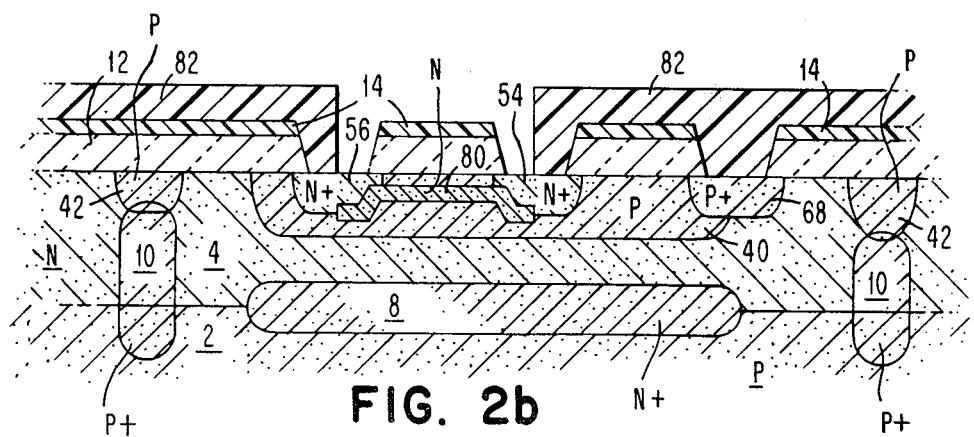
FIG. 2b is a cross-sectional view of the structure of FIG. 2a, after the ion-implanted channel region 80 has been introduced.
Figure 3:
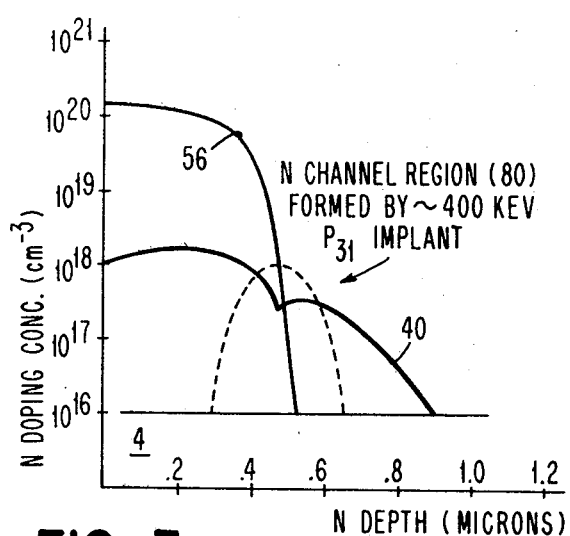
FIG. 3 is a doping profile of the structure of FIG. 2b showing the N channel region 80 formed in the NPN base region 40.

FIG. 1 shows a doping concentration profile of the implanted emitter-base structure after complete processing. FIG. 2a corresponds to the NPN transistor structure of FIG. 3I in the referenced copending application, with the omission of the collector diffusion 38 and the extension of the base region 40 to envelop the N+ diffusion 56. In FIG. 2a, N+ diffusions 56 and 54 form the drain and source regions of the JFET, respectively. The P-type region 40 is the JFET gate and the P+ region 68 is the gate contact. All other numbered structures in FIG. 2a correspond to the same numbered structures in FIG. 3I of the referenced application. FIG. 2b shows the subsequent photoresist layer masking 82 and implant step used to form the JFET channel 80. The channel implant 80 need only be juxtaposed to N+ regions 56 and 54. The channel length is defined by the spacing between regions 54 and 56. The channel width is defined by implant mask layer 84. FIG. 3 shows a doping concentration profile of the JFET detailing the N-type region formed by the ~400 Kev low dose phosphorus or other N-type implant. The dose is used to determine the extent to which the P-type base region 40 is compensated and hence the gate threshold voltage of the JFET. FIG. 3 indicates the peak of the phosphorous is implanted to lie in the region between the two peaks of the double boron implant used to define the base region 40 of the NPN. Such a structure has very controllable characteristics and is limited by the control of dose and energy used to define the P base and N-channel regions.

Dense JFET arrays are possible since they can be placed in a common N-type epitaxial region.

The high performance JFET structure and process described above is compatible with high performance NPN and PNP transistors. The JFET can be employed as a switched device or as an active load in a bipolar logic circuit and is formed in the P-type base diffusion 40 of what would otherwise have been an NPN transistor. The high performance JFET is merged in a bipolar/FET device which forms a dense, two level logic function. In the BIFET merged device, the JFET and bipolar transistor share common elements in order to reduce the number of interconnection contact windows and the required silicon area. Both NPN type BIFET and PNP type BIFET are disclosed. The merged JFET and bipolar transistor provide better than a 30% area reduction when compared to their non-merged precursors.

Figure 4:
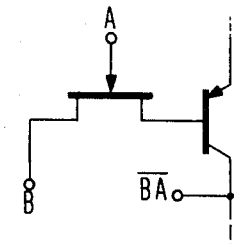
FIG. 4 is an electrical circuit schematic of the merged PNP/JFET device forming the logical function NAND.
Figure 8:
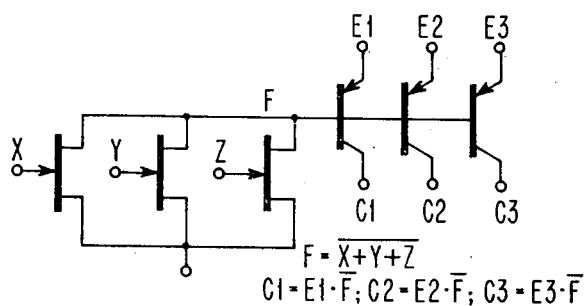
FIG. 8 is an electrical schematic showing the formation of multiple JFET device and/or multiple emitter-/collector PNPs for expanded logic function.
Figure 7:
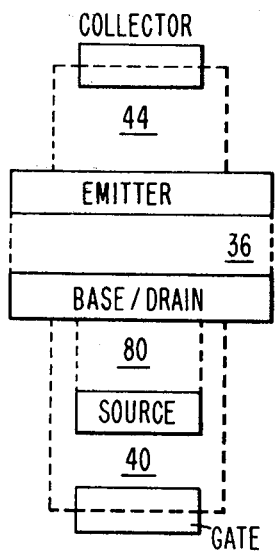
FIG. 7 is a plan view of the structure shown in FIG. 6.

As shown by the schematic of FIG. 4, the double diffused PNP and JFET can be connected to form a logical NAND function of inputs A and B. An implementation of that logic gate is shown in the cross-section of FIG. 5, where the conventional PNP device is fabricated as shown in FIGS. 3A through 3I of the referenced copending application. The JFET is shown in FIG. 2b, herein. By combining the common N-type epitaxial regions 4 and the PNP base contact 70, 34 and JFET drain 56 the physical size of the logic gate can be reduced by ~30%. The cross-section of this merged structure is shown in FIG. 6 where the deep N region 36 forms the PNP base contact and JFET drain. The deep N region 36 can be used to form the JFET drain since it is self-aligned to and is isolated from the shallower N+ source region 54 by P gate region 40. The plan view is shown in FIG. 7 where the channel region 20 is shown bounded by the P gate region 40, and the drain/base contact 36, and source 54. This concept is extendable to form multiple JFET's and/or multiple emitter/collector PNP's for expanded logical functions. This would be done by repeating the layout of FIG. 7 in the vertical direction in a common epitaxial region. The schematic of such a cell is shown in FIG. 8. The common node F corresponds to the common epitaxial region.

Figure 12:
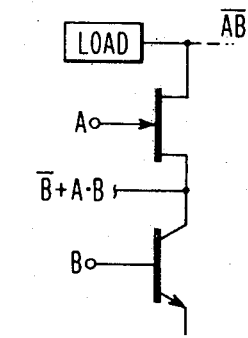
FIG. 12 is an electrical circuit schematic of the merged NPN and N channel JFET structure for accomplishing a complex logical function of a NAND, and other complex logical functions.
Figure 11:
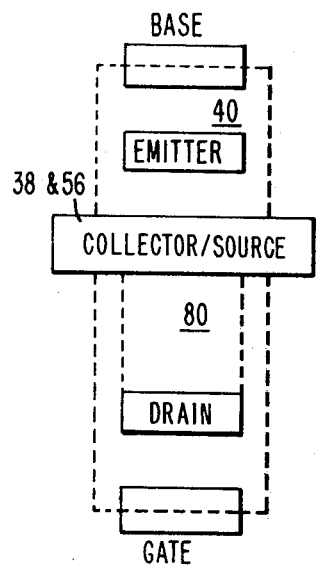
FIG. 11 is a plan view of the structure shown in FIG. 10.
Figure 9:
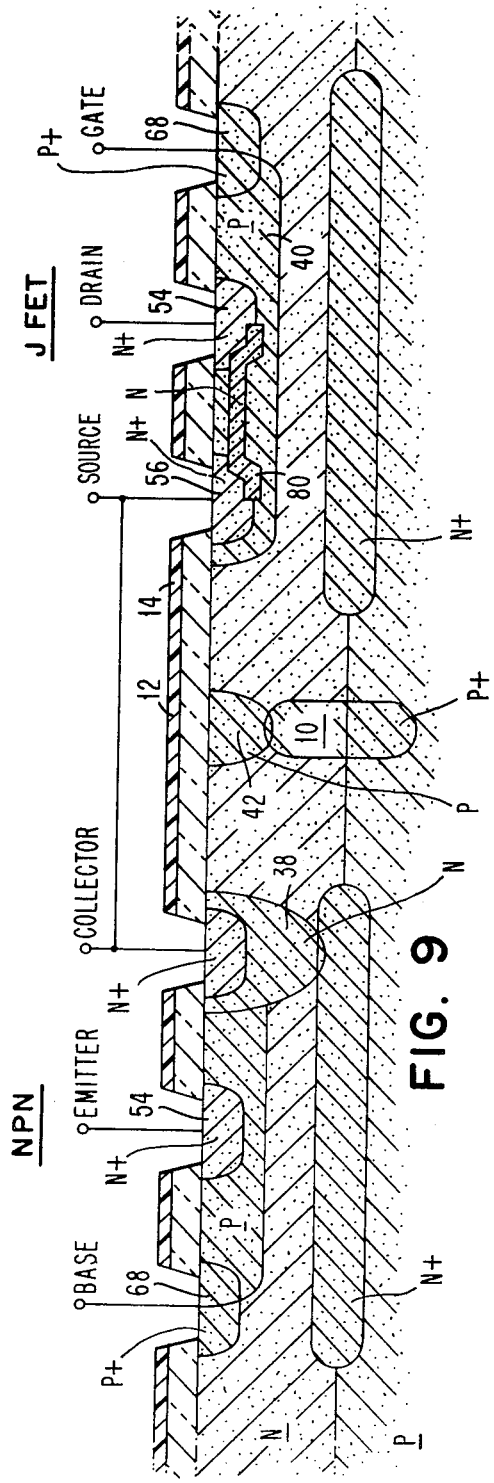
FIG. 9 is a cross-sectional view of a conventional NPN and the N channel JFET invention device where the NPN transistor is fabricated by the same process as shown in FIGS. 3A through 3I of the referenced copending patent application, with the omission of the reach through 38, and the JFET is fabricated as was disclosed in FIG. 2B, herein.
Figure 10:
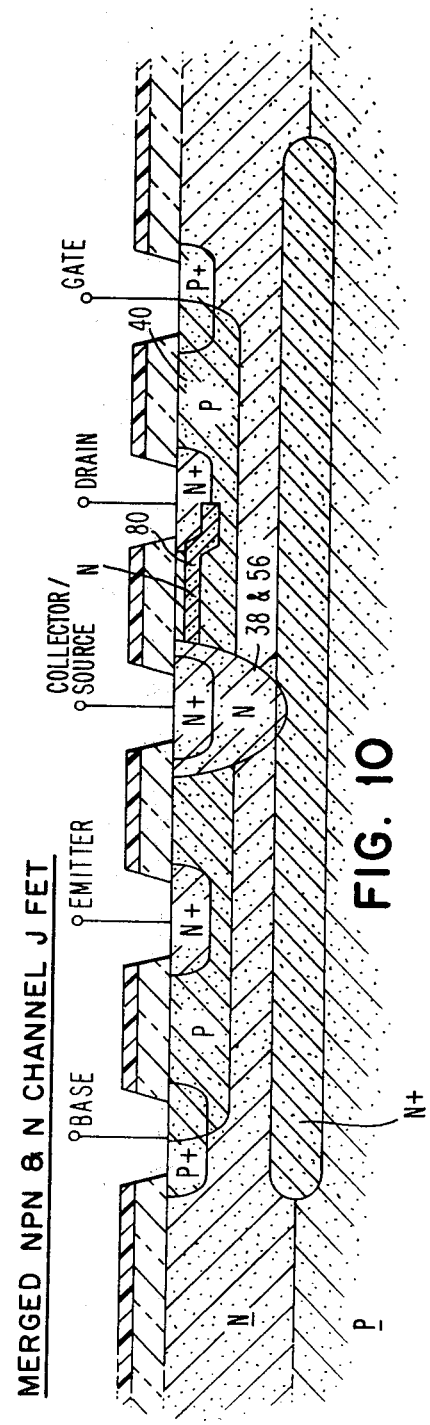
FIG. 10 is a cross-sectional view of the merged NPN and N channel JFET of FIG. 9, where the reach through collector 38 has been combined to serve as the NPN collector and the source of the JFET.

This scheme can be also used to merge the source with the collector of a conventional NPN transistor to achieve the logical function shown in FIG. 12. An implementation of that logic gate using the conventional NPN device is shown in cross-section in FIG. 9. The NPN of FIG. 9 is formed as in FIGS. 3A through 3I of the referenced copending application. The JFET is formed as shown in FIG. 2b, herein. By combining the reach through collector 38 to serve as both the NPN collector and source of the JFET, the physical size of the logic gate can be reduced by approximately 34% as shown in cross-section of FIG. 10 and plan view of FIG. 11. The reduction comes from the elimination of the separate source contact region 56 and the intervening isolation 42 and epitaxial region.

Combinations of the above schemes can be used to fabricate several combinations of logical functions with significant savings in silicon area.

Figure 13:
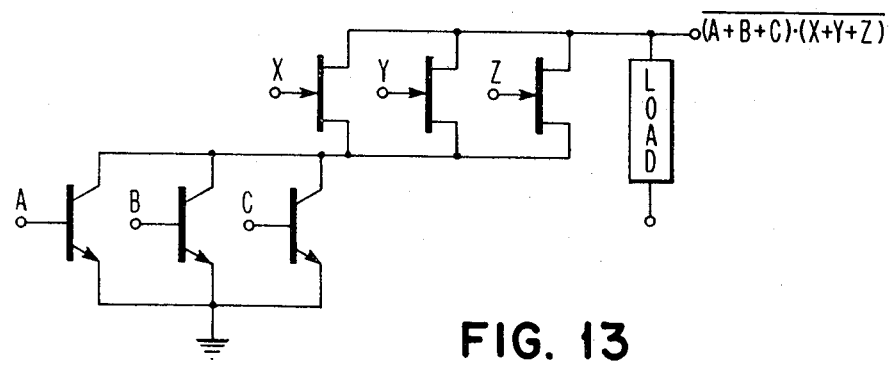
FIG. 13 is an electrical schematic showing that more than one JFET and/or more than one bipolar transistor can be placed in parallel to form expanded logical gates for a complex logical function.

FIG. 13 shows the electrical schematic of several merged NPN and JFET transistors in accordance with the invention.

Figure 15:
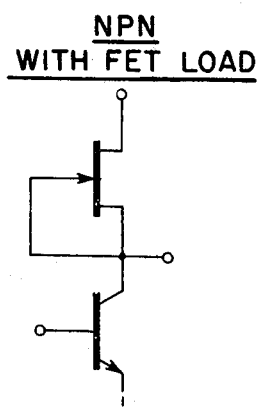
FIG. 15 is an electrical schematic of the merged JFET load and NPN transistor.
Figure 14:
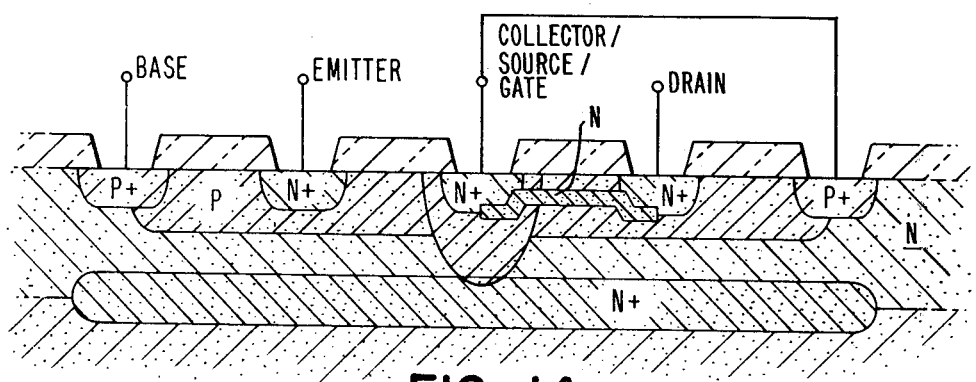
FIG. 14 is a cross-sectional view of a JFET as a variable load when merged with an NPN bipolar transistor.

Further, the JFET can be used as a variable load when merged with the NPN by electrically tying the gate to the merged collector source. This is shown in cross-section in FIG. 14 and in circuit schematic of FIG. 15. The JFET becomes nonconductive (pinched off) when the NPN collector is low (conductive). The JFET is conductive when the NPN collector is high (non-conductive).

The JFET, as an active load in a bipolar logic circuit, provides a controllable impedance for reduced power dissipation with a minimal increase of the complexity of the bipolar process.

The merged JFET/bipolar device provides a very dense logic function when the JFET is used as a switch, yielding a 30% area reduction for the JFET/PNP and a 34% area reduction for the JFET/NPN, when compared with unmerged layouts. When the JFET is used as an active load device in a bipolar circuit, it provides a substantially reduced power dissipation characteristic over other types of load. The JFET/bipolar structure is extendable to multiple JFET/bipolar transistors for the implementation of complex logic functions.

While the invention has been particularly shown and described with reference to the preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. In a process for forming an integrated circuit having a plurality of P-type regions formed in the same process step, a first subplurality of which are P-type base regions of vertical NPN transistors, a process for forming JFET device in one of the second subplurality of said plurality of P-type regions, comprising the steps of:
   forming an insulating layer on the surface of said base region having first and second windows therein;
   simultaneously forming first and second spaced apart N-type regions in said base region through said first and second windows for the JFET source and drain; and
   ion implanting an N-type channel region in said base region connected to said source and drain regions;
   said P-type base region serving as the gate for the JFET device;
   whereby a JFET device may be formed in the base region of an NPN transistor.

2. The process of claim 1, which further comprises:
   forming one P-type region to extend horizontally beyond said first N-type region, with said first N-type region extending horizontally and vertically to separate said one P-type region into first and second P-type portions which are electrically isolated from one another, said first portion being said gate for said JFET device;
   forming a third window in said insulating layer over said second P-type portion; and
   forming a third N-type region through said third window, as an emitter in an NPN transistor formed with said second P-type portion as the base and said first N-type region serving as the collector thereof;
   whereby a series connected JFET and NPN bipolar transistor are formed with said first N-type diffusion serving as the output node thereof.

3. The process of claim 2 which further comprises:
   forming a conductor connecting said first P-type portion to said first N-type region;
   whereby said JFET operates as a self-biased load device connected in series with the collector of sand NPN bipolar transistor.

4. In a process for forming an integrated circuit having a plurality of P-type regions formed in the same process step, a first subplurality of which are P-type collector regions of graded base lateral PNP transistors, a process for forming a JFET device in one of a second subplurality of said plurality of P-type regions, comprising the steps of:
   forming an insulating layer on the surface of said collector region having first and second windows therein;
   simultaneously forming first and second spaced apart N-type regions in said base region through said first and second windows for JFET source and drain; and
   ion-implanting an N-type channel region in said collector region connected to said source and drain regions;
   said P-type collector region serving as the gate for the JFET device;
   whereby a JFET device may be formed in the collector region for a double diffused lateral PNP transistor.

5. The process of claim 4, which further comprises:
   forming said one P-type region to extend horizontally beyond said first N-type region, said first N-type region extending horizontally and vertically to separate said one P-type region into first and second P-type portions which are electrically isolated from one another, said first portion being said gate for said JFET device;
   forming a third window in said insulating layer over said second P-type portions; and
   forming a third N-type region through said third window as a base region and a second P-type region through said third window and contained within said third N-type region as the emitter of a PNP lateral transistor, formed simultaneously with said second P-type portion as the collector thereof;
   whereby series connected JFET and lateral PNP bipolar transistors are formed.

* * * * *